United States Patent [19]
Manning

[11] Patent Number: 5,940,691
[45] Date of Patent: Aug. 17, 1999

[54] METHODS OF FORMING SOI INSULATOR LAYERS AND METHODS OF FORMING TRANSISTOR DEVICES

[75] Inventor: H. Montgomery Manning, Kuna, Id.

[73] Assignee: Micron Technology, Inc., Boise, Id.

[21] Appl. No.: 08/916,773

[22] Filed: Aug. 20, 1997

[51] Int. Cl.$^6$ .......................... H01L 21/00; H01L 21/326
[52] U.S. Cl. .......................... 438/151; 438/166; 438/466
[58] Field of Search ................................. 438/151–166, 438/149, 466, 468

[56] References Cited

U.S. PATENT DOCUMENTS

| | | | |
|---|---|---|---|
| 5,198,379 | 3/1993 | Adan | 437/41 |
| 5,482,870 | 1/1996 | Inoue | 437/21 |
| 5,556,503 | 9/1996 | Ogura | 156/345 |
| 5,618,741 | 4/1997 | Young et al. | 438/151 |
| 5,650,042 | 7/1997 | Ogura | 156/655.1 |
| 5,665,613 | 9/1997 | Nakashima et al. | 438/151 |
| 5,807,770 | 9/1998 | Mineji | 438/151 |
| 5,807,772 | 9/1998 | Takemura | 438/157 |
| 5,854,509 | 12/1998 | Kunikiyo | 257/706 |
| 5,866,468 | 2/1999 | Kono et al. | 435/458 |

OTHER PUBLICATIONS

Ogura, A., "Control of Thickness Variation in Si–on–Insulator Bonded Wafers by Applying Voltage during KOH Etching", Jpn. J. Appl. Phys. vol. 35 (1996), pp. L71–L73, Part 2, No. 1B. Month Unknown.

*Primary Examiner*—John F. Niebling
*Assistant Examiner*—Michael S. Lebentritt
*Attorney, Agent, or Firm*—Wells, St. John, Roberts, Gregory & Matkin, P.S.

[57] ABSTRACT

The invention encompasses methods of forming individual silicon-on-insulator layers having varying thicknesses within the individual layers. The invention also encompasses methods of forming transistor devices from silicon-on-insulator layers. Additionally, the invention encompasses semiconductor devices and assemblies utilizing silicon-on-insulator layers. The invention includes a method comprising: a) providing a substrate; b) providing an insulator layer over the substrate; c) providing a semiconductive layer over the insulator layer, the semiconductive layer having a first portion and a second portion; d) forming a depletion region within the semiconductive layer and proximate the insulator layer, the depletion region having a different thickness in the first portion than in the second portion; and f) etching the semiconductive layer to about the depletion region. The invention also includes a method comprising: a) providing a semiconductive substrate; b) forming a conductivity-modifying diffusion region in only a portion of the substrate; c) forming an insulator layer over the semiconductive substrate; d) forming a semiconductive layer over the insulator layer; e) forming a depletion region within the semiconductive layer, the depletion region being proximate the insulator layer and having a different thickness over the conductivity-modifying diffusion region than over other portions of the substrate; and f) etching the semiconductive layer to about the depletion region.

35 Claims, 8 Drawing Sheets

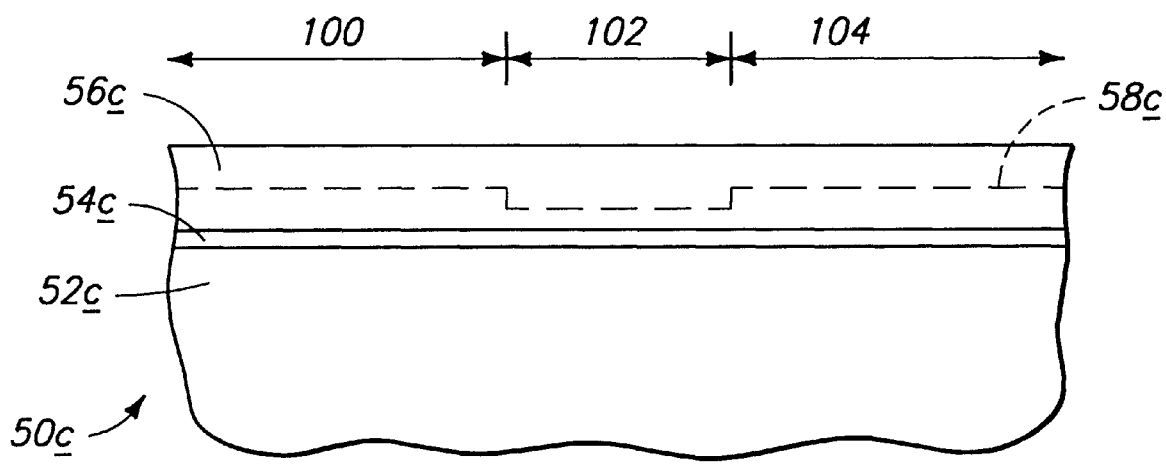
_FIG. 7_
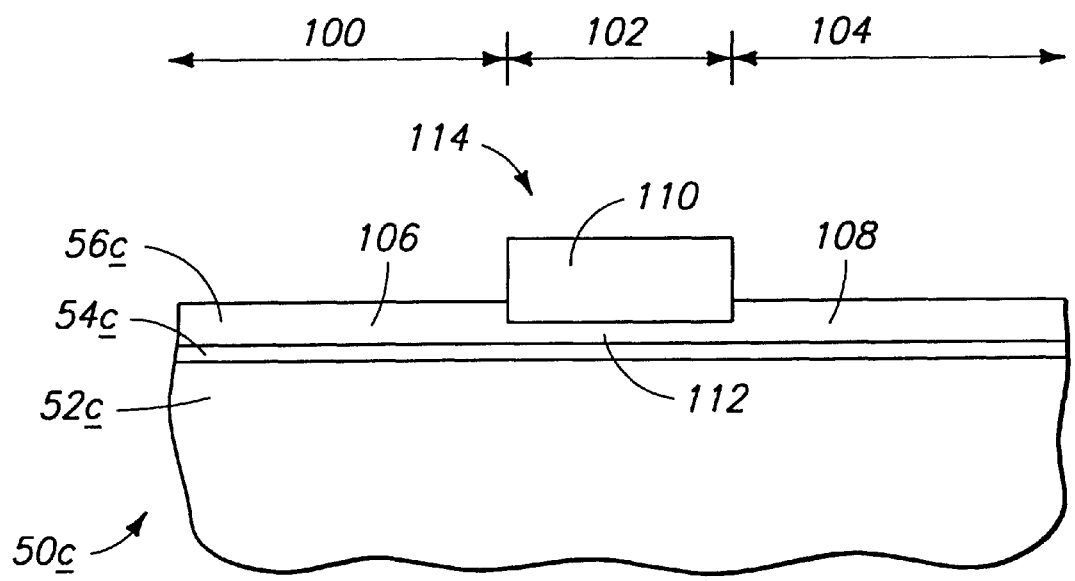
_FIG. 8_

METHODS OF FORMING SOI INSULATOR LAYERS AND METHODS OF FORMING TRANSISTOR DEVICES

TECHNICAL FIELD

The invention pertains to methods of forming silicon-on-insulator layers, methods of forming transistor devices, and to semiconductor devices and assemblies.

BACKGROUND OF THE INVENTION

Numerous semiconductor devices and assemblies may be formed utilizing silicon-on-insulator (SOI) constructions. Such assemblies can include, for example, fully depleted SOI devices or partially-deleted SOI devices. Among SOI devices are n-channel transistors and p-channel transistors. Such transistors can, depending on the desired characteristics, be either fully depleted SOI devices or partially depleted SOI devices. Also, such transistors can be incorporated into specific types of devices, such as, for example, memory array transistor devices and peripheral transistor devices.

There are generally two ways of providing a starting substrate for SOI fabrication. In a first method, oxygen is implanted at a desired depth into a silicon wafer. The wafer is then subjected to an anneal to form a buried silicon dioxide layer having an outward monocrystalline silicon layer thereover. The anneal can also repair damage caused by the implant, although the repair is typically not perfect.

In a second method, a silicon wafer is initially provided with an outer silicon dioxide layer. Such outer silicon dioxide layer can be formed, for example, by exposing the wafer to an oxidizing ambient. After formation of the outer silicon dioxide layer, a separate silicon wafer is positioned against the silicon dioxide layer to form a composite comprising the silicon dioxide layer sandwiched between a pair of silicon wafers. The composite is heated in a furnace to cause fusing of the silicon wafers with the silicon dioxide. Thereafter, the second silicon wafer is mechanically polished down to a desired thickness such that its remnants constitute an SOI construction.

In many applications, it is desired to have an SOI construction in which the silicon layer has a substantially uniform thickness throughout its construction. A method for improving the uniformity of thickness of a silicon layer in an SOI construction is described with reference to FIG. 1, which illustrates an apparatus 10 configured for electrostatically etching a silicon layer of a SOI construction. Apparatus 10 comprises a vessel 12 within which is an etching composition 14 preferably comprising potassium hydroxide. A heater 16 is provided within etching composition 14 to control a temperature of the composition during an etching process. An SOI construction 18 is supported within vessel 12 by a TEFLON (TM) holder 20 which comprises a back support 22 and a front support 24. SOI construction 18 is compressed between back support 22 and front support 24. A first O-ring 26 is between SOI construction 18 and front support 24 and seals a back of SOI construction 18 from exposure to etching composition 14. A second O-ring 34 seals front support 24 against back support 22. An electrode 28 extends across a back of SOI construction 18 and supports the back of SOI construction 18 while also providing an electrical connection to SOI construction 18. Electrode 28 is electrically connected through a voltage supply 30 to a platinum electrode 32 extending within etching composition 14.

An expanded view of zone 2 of FIG. 1 is shown in FIG. 2. As shown, SOI construction 18 comprises a substrate portion 40, an insulator layer 42, and a silicon layer 44. Silicon layer 44 is a "frontside" of construction 18 and substrate 40 is a "backside" of construction 18. Frontside 44 is exposed to etching composition 14.

In operation, silicon layer 44 is generally lightly doped, with, for example, a p-type conductivity-enhancing dopant. A voltage is provided with voltage supply 30 to force a depletion region 46 to be formed within silicon layer 44. Etching composition 14 then etches silicon layer 44 to about depletion region 46 and stops. A thickness of depletion region 46 can be controlled by controlling a voltage provided by voltage supply 30. Although it is not clear if the etching composition stops etching at the depletion layer, or at some location near the depletion layer, it is clear that the amount of silicon etched from layer 44 can be controlled by controlling a thickness of depletion layer 46.

In operation, a 20% (wt) potassium hydroxide solution is typically used as an etchant and 50–75 volts are applied by voltage supply 30 for a typical etching duration of about six minutes. The temperature of the potassium hydroxide solution is typically controlled to be about 70° C. with temperature controller 16.

The above-discussed methods of forming SOI constructions are utilized to form constructions in which the silicon layer has a relatively uniform thickness. However, in accordance with the invention which follows it is recognized that there may be some applications in which it is desirable to form SOI constructions having a silicon layer of varying thickness. Accordingly, methods are described for creating SOI constructions in which the silicon layer has a varying thickness. Also described are assemblies and devices designed to take advantage of an construction within which the silicon layer has a varied thickness.

SUMMARY OF THE INVENTION

The invention encompasses methods of forming SOI constructions having varying thicknesses within the silicon layer. The invention also encompasses methods of forming transistor devices from such SOI constructions. Additionally, the invention encompasses semiconductor devices and assemblies utilizing SOI constructions which have varying thicknesses of the silicon layer.

In one aspect, the invention encompasses a method of forming a semiconductor-on-insulator layer wherein a substrate is provided, an insulator layer is provided over the substrate and a semiconductive layer is provided over the insulator layer. The semiconductive layer has a first portion and a second portion. A depletion region is formed within the semiconductive layer proximate the insulator layer. A thickness of the depletion region is controlled to form a different thickness in the first portion than in the second portion. The semiconductive layer is etched to about the depletion region.

In another aspect, the invention encompasses a method of forming a semiconductor-on-insulator layer wherein a semiconductive substrate is provided. The semiconductive substrate has a substantially uniform doping with a first impurity. A first portion of the semiconductive substrate is doped with a second impurity. A second portion of the semiconductive substrate is doped with a third impurity. A third portion of the semiconductive substrate is left undoped with either of the second impurity or the third impurity. An insulator layer is formed over the semiconductive substrate. A semiconductive layer is formed over the insulator layer. The semiconductive layer is substantially uniformly doped with a p-type impurity. A depletion region is formed within the semiconductive layer. The depletion region is formed over the first portion, the second portion and the third portion. The depletion region is thicker over the first portion of the substrate relative to over the second and third portions. The depletion region is thinner over the second portion of the substrate relative to over the first and third portions. The semiconductive layer is exposed to an electrolytic etching composition to etch the semiconductive layer to about the depletion region.

In another aspect, the invention encompasses a method of forming a thin film transistor wherein a substrate is provided. A source template portion, a channel template portion and a drain template portion of the substrate are defined. The source and drain template portions are doped differently than the channel template portion. An insulator layer is formed over the substrate. A semiconductive layer is formed over the insulator layer. A depletion region is formed within the semiconductive layer. The depletion region is over the source template portion, the channel template portion and the drain template portion. The depletion region is proximate the insulator layer, and is thinner over the channel template portion than over the source and drain template portions. The semiconductive layer is exposed to an electrolytic etching composition to etch the semiconductive layer to about the depletion region. The etched semiconductive layer is thinner over the channel template portion than over the source and drain template portions. The etched semiconductive layer over the channel template portion comprises a transistor channel, the etched semiconductive layer over the source template portion comprises a transistor source, and the etched semiconductive layer over the drain template portion comprises a transistor drain. A transistor gate is formed proximate the transistor channel. The transistor source, transistor drain, transistor channel and transistor gate are incorporated into a thin film transistor.

BRIEF DESCRIPTION OF THE DRAWINGS

Preferred embodiments of the invention are described below with reference to the following accompanying drawings.

FIG. 7 is a fragmentary cross-sectional view of a silicon-on-insulator construction at a preliminary step of a fourth embodiment process of the present invention.

FIG. 8 is a fragmentary cross-sectional view of the FIG. 7 silicon-on-insulator construction shown at processing step subsequent to that of FIG. 7.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention generally encompasses methods of controlling a thickness of a semiconductor layer in a semiconductor-on-insulator assembly, encompasses methods of incorporation of such SOI assemblies into circuitry devices, and encompasses circuitry devices incorporating such SOI assemblies.

Figure 2:
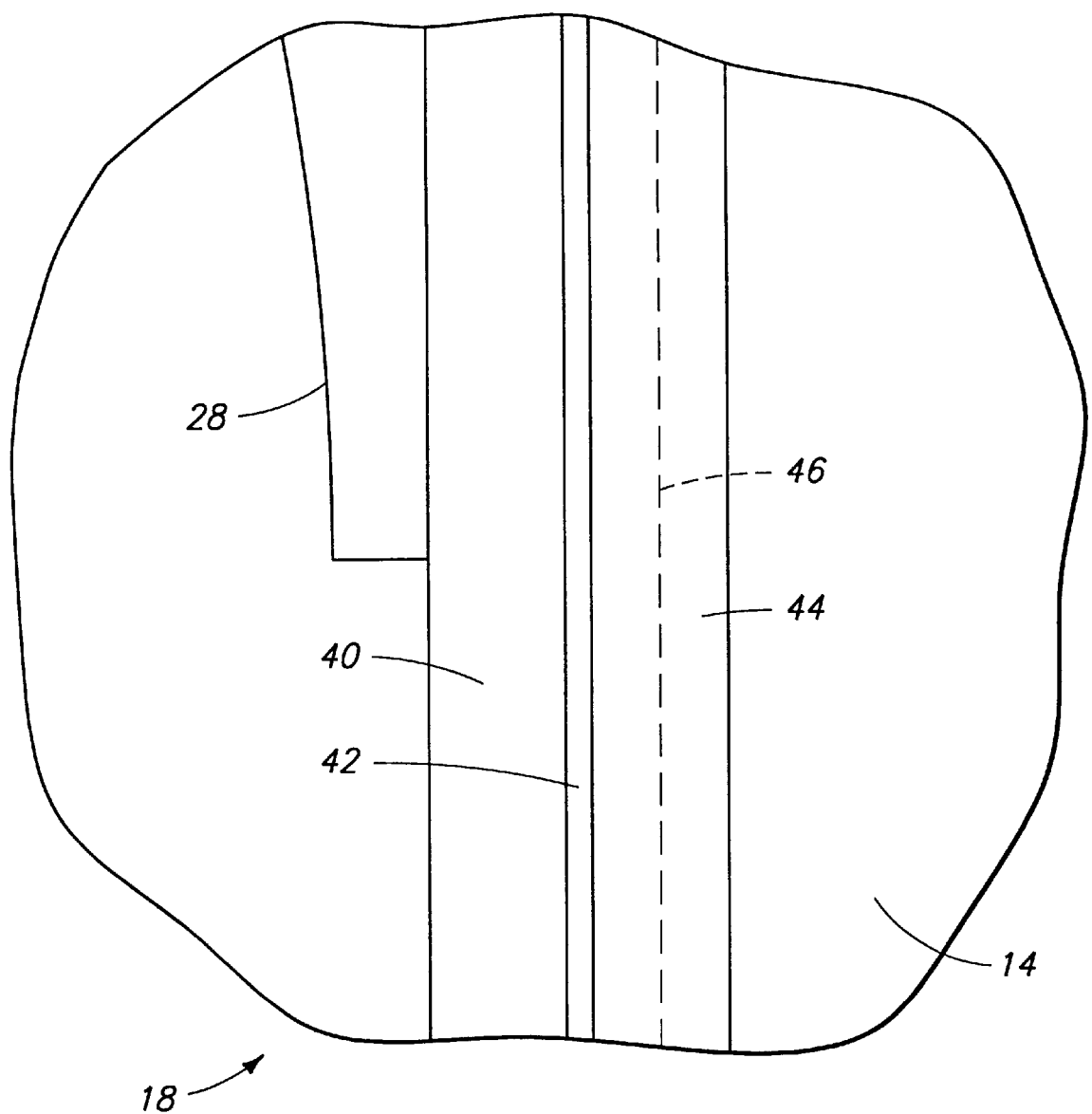
FIG. 2 is an expanded view of the zone labeled 2 in FIG. 1.
Figure 3:
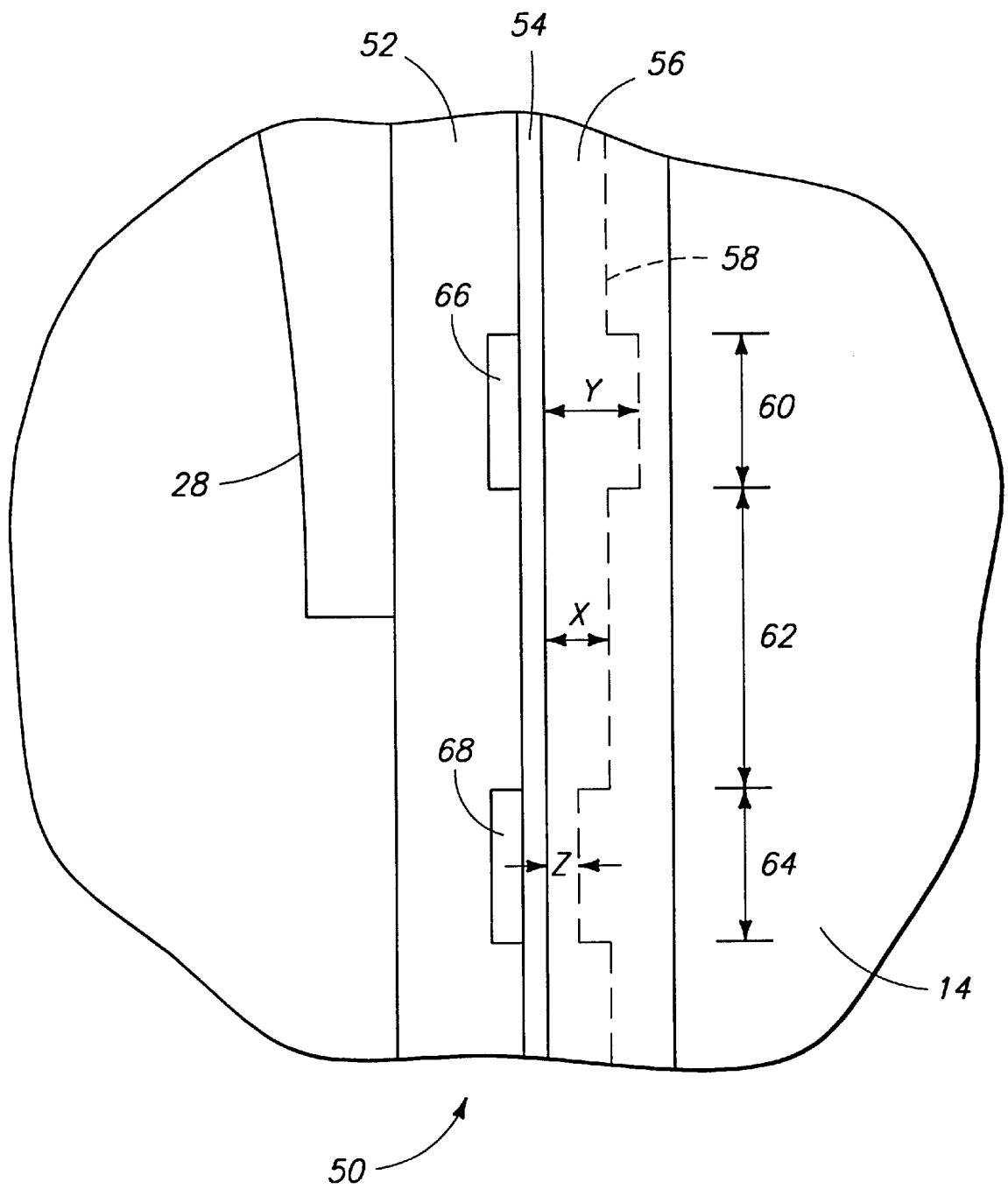
FIG. 3 is a fragmentary cross-sectional view of a silicon-on-insulator construction shown at a preliminary step of a first embodiment process of the present invention, and shown in an expanded view similar to that of FIG. 2.

A first embodiment method of the present invention is discussed with reference to FIGS. 3 and 4. Referring to FIG. 3, an SOI assembly 50 is illustrated. SOI assembly 50 is illustrated in an expanded view similar to that of FIG. 2, with SOI construction 50 being treated with electrolytic etching apparatus 10 of FIG. 1. SOI construction 50 comprises a substrate 52, an insulator layer 54 and a semiconductive layer 56 over insulator layer 54. Semiconductive layer 56 preferably comprises a semiconductive material, such as silicon doped with a p-type conductivity enhancing dopant. Insulator layer 54 can comprise a number of materials known to persons of ordinary skill in the art, including, for example, silicon dioxide and silicon nitride.

An electrode 28 is electrically connected with substrate 52 and an etching composition 14 is adjacent an outer surface of semiconductive layer 56. Electrode 28 is connected to a voltage supply 30 (shown in FIG. 1) which is in turn connected to an electrode 32 (shown in FIG. 1). Electrode 32 can be a platinum electrode, or can comprise other electrode materials. Voltage supply 30 (shown in FIG. 1) is utilized to form a depletion region 58 (shown in dashed line) within semiconductive layer 56.

SOI construction 50 comprises three portions 60, 62 and 64, having differing thicknesses of depletion region 58. The differing thickness of depletion region 58 in portions 60, 62 and 64 is caused by forming differing electric fields in portions 60, 62 and 64. The shown first embodiment method of controlling the thickness of depletion region 58 encompasses providing doped regions 66 and 68 within substrate 52 to define portions 60 and 64, while portion 62 is defined by the uniform dopant concentration within substrate 52.

In the shown embodiment, substrate 52 comprises a semiconductive material, such as silicon, which is uniformly conductively doped to from about $10^{15}$ to about $10^{18}$ atoms/$cm^3$ with either a p-type or an n-type conductivity enhancing dopant. Doped regions 66 and 68 are provided with conductivity enhancing dopant which is either a different type from that utilized to uniformly dope substrate 52, or which is at a different concentration from the uniform substrate doping of substrate 52. For instance, if substrate 52 is blanket doped with a p-type conductivity enhancing dopant to a concentration of from $10^{15}$ to about $10^{18}$ atoms/$cm^3$, region 66 could comprise a p-type conductivity enhancing dopant provided to a concentration of from about $10^{18}$ to about $10^{20}$ atoms/$cm^3$, and more preferably from about $10^{18}$ to about $10^{19}$ atoms/$cm^3$. Region 66 will comprise a higher concentration of p-type conductivity enhancing dopant than the portion of substrate 52 within portion 62. The higher concentration of p-type conductivity enhancing dopant within region 66 relative to the substrate 52 within portion 62 causes depletion region 58 to be thicker within portion 60 than within portion 62.

Dopant region 68 can comprise an n-type conductivity enhancing dopant provided to a concentration of from $10^{17}$ to about $10^{20}$ atoms/cm$^3$. The n-type dopant of region 68 causes depletion region 58 to be thinner within portion 64 than within portions 60 and 62.

Doped regions 66 and 68 can alternatively be referred to as conductivity-modifying diffusion regions 66 and 68. Conductivity-modifying diffusion regions 66 and 68 alter a conductivity induced by voltage supply 30 (shown in FIG. 1) within semiconductive layer 56 and thereby modify the thickness of depletion region 58 within portions 60 and 64.

An alternate way of viewing the FIG. 3 construction is that a predominate portion of depletion region 58 comprises a base thickness "X" defined by the thickness within portion 62. Depletion region 58 comprises stepped segments at portions 60 and 64 which have thicknesses "Y" and "Z" that are different from base thickness "X".

Figure 1:
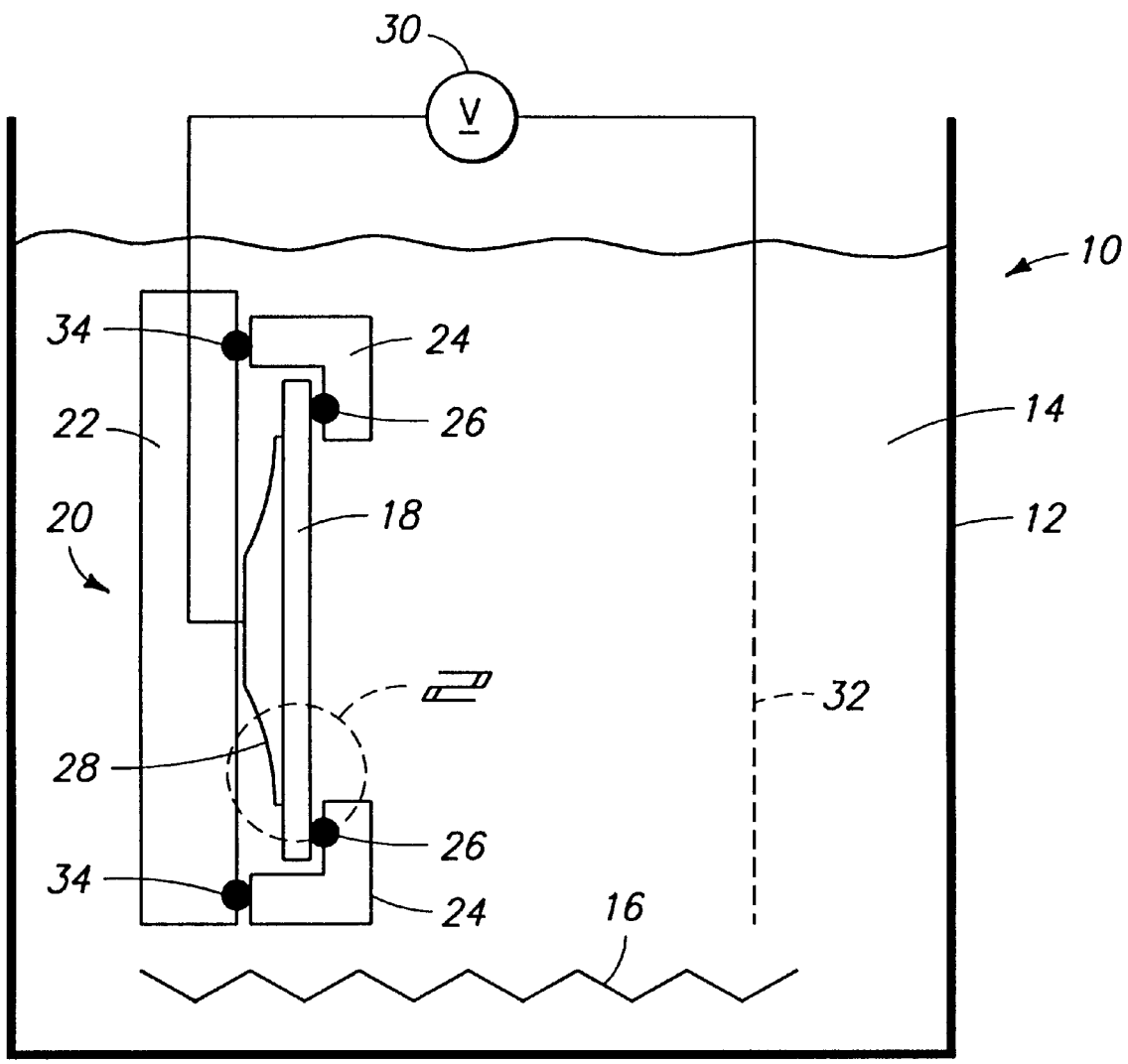
FIG. 1 is a diagrammatic cross-sectional view of a prior art apparatus for electrostatically etching a silicon layer of an SOI construction.
Figure 4:
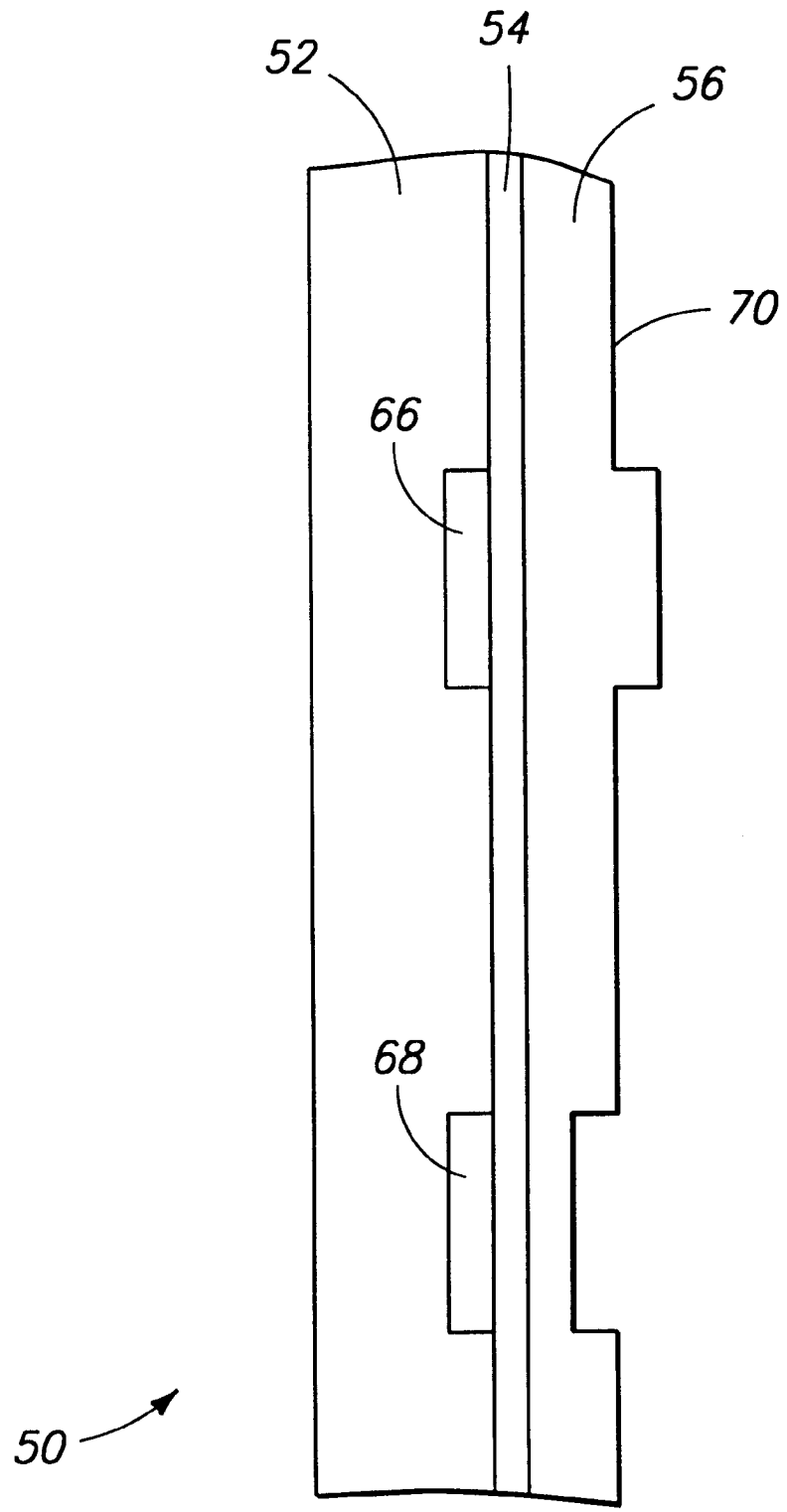
FIG. 4 is a view of the FIG. 3 silicon-on-insulator construction shown at a processing step subsequent to that of FIG. 3.

Referring to FIG. 4, SOI construction 50 is shown after etching composition 14 (shown in FIG. 3) etches to about depletion region 58 (shown in FIG. 3) to form the illustrated undulating outer surface 70 on semiconductive layer 56, and after SOI construction 50 is removed from apparatus 10 (shown in FIG. 1).

A second embodiment method for controlling a thickness of a depletion region within an SOI assembly is described with reference to FIG. 5. In referring to FIG. 5, similar labeling will be utilized as was used in describing the first embodiment of FIG. 3, with differences being indicated by the suffix "a," or by different numerals.

Figure 5:
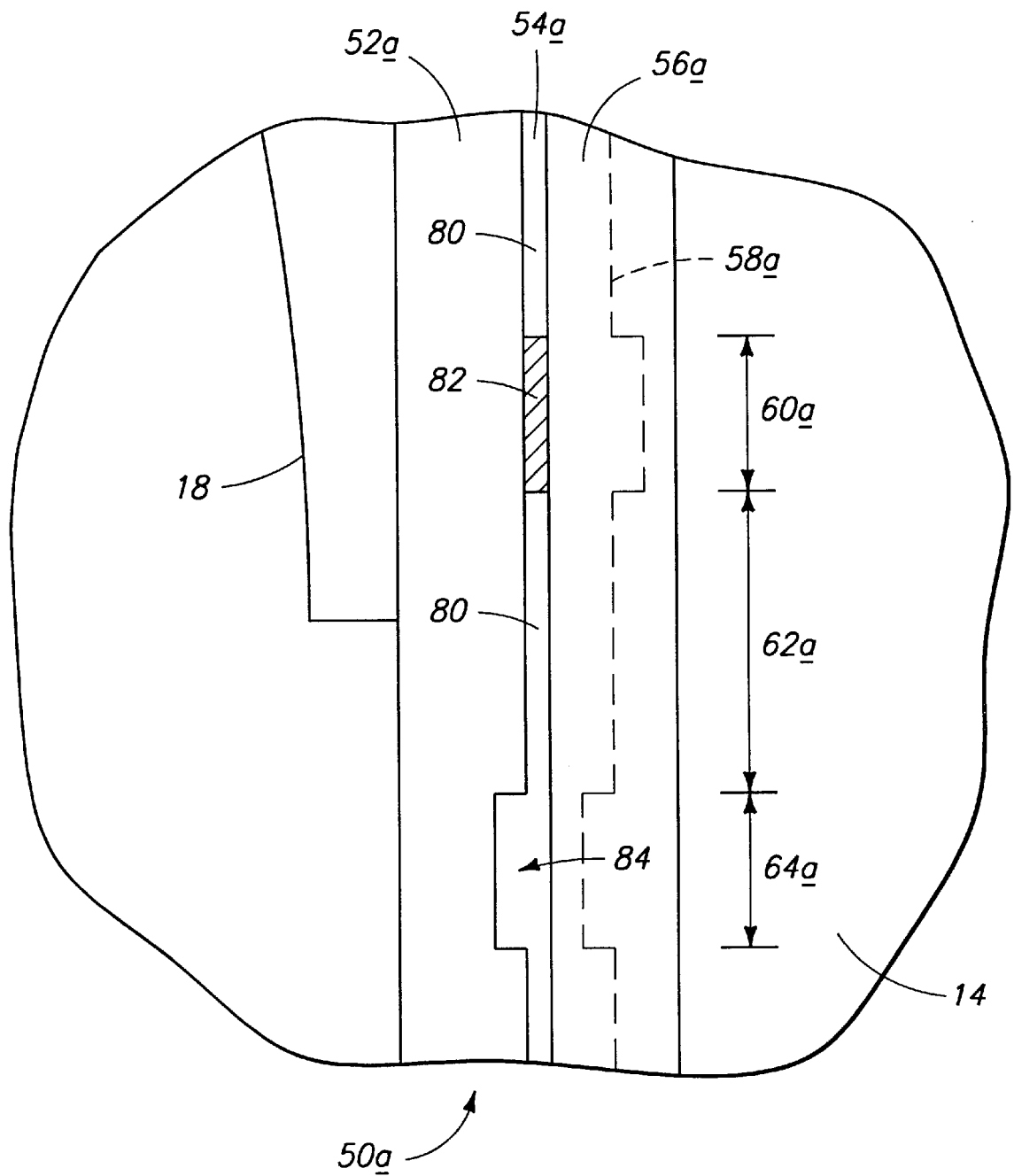
FIG. 5 is a fragmentary cross-sectional view of a silicon-on-insulator construction shown at a preliminary step of a second embodiment process of the present invention, and shown in an expanded view similar to that of FIG. 2.

Referring to FIG. 5, an SOI construction fragment 50a is illustrated. Fragment 50a is shown in an expanded view similar to the views of FIGS. 2 and 3, and is within an apparatus 10 (shown in FIG. 1). SOI construction 50a comprises a substrate 52a, an insulator layer 54a and a semiconductive material layer 56a. Substrate 52a preferably comprises a semiconductive material conductively doped with either p-type conductivity enhancing dopant or with n-type conductivity enhancing dopant. Semiconductive material 56a preferably comprises a material, such as silicon, conductively doped with p-type conductivity enhancing dopant.

SOI construction 50a comprises three portions 60a, 62a and 64a, each defined by a differing thickness of depletion region 58a.

Insulator layer 54a is modified to form regions of varying insulator thickness and thereby to form the differing thicknesses of portions 60a, 62a and 64a. Insulator layer 54a comprises a first material 80 at portion 62a and a second material 82, which is different from first material 80, at portion 60a. In the shown embodiment, second material 82 has a higher dielectric constant than first material 80. Such could be accomplished by, for example, utilizing silicon nitride as second material 82 and silicon oxide as first material 80. The high dielectric constant of material 82 causes depletion region 58a to be thicker at portion 60a than at portion 62a.

Insulator layer 54a is thickened at portion 64a more than at portion 62a, and is displaced inwardly into substrate 52a at portion 64a relative to portion 62a. Such thickening and inward displacement of layer 54a can be accomplished by, for example, forming a trench 84 within substrate 52a at portion 64a and subsequently filling trench 84 with insulator layer 54a. The thickening and inward displacement of insulator layer 54a within portion 64a, relative to portion 62a, causes depletion region 58a to be thinner at portion 64a relative to portion 62a.

After formation of depletion region 58a, electrolytic etching component 14 (shown in FIG. 1) can be utilized to etch to about depletion region 58a to form an SOI construction having an undulating outer surface shaped similar to depletion region 58a.

Figure 6:
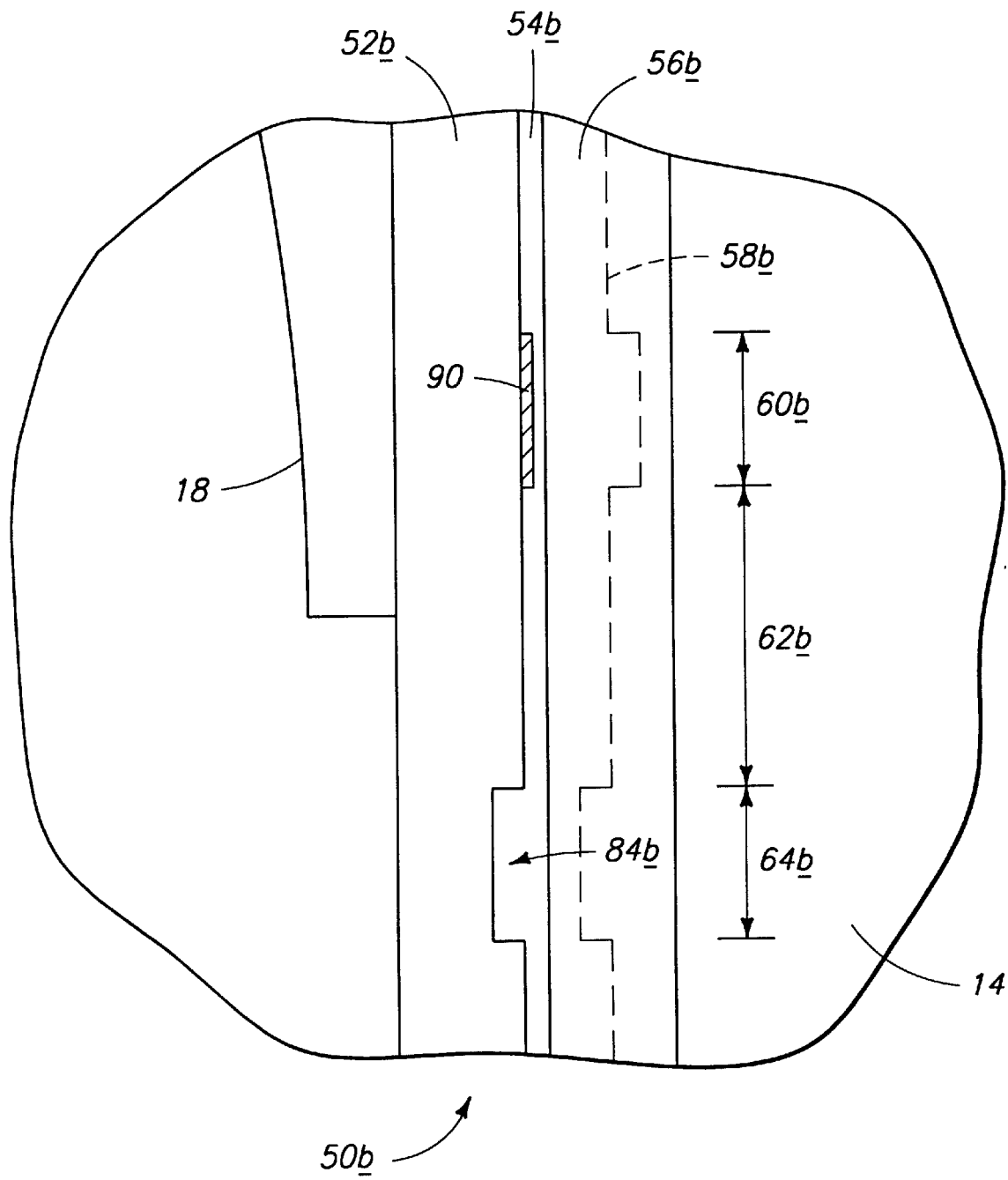
FIG. 6 is a fragmentary cross-sectional view of a silicon-on-insulator construction shown at a preliminary step of a third embodiment process of the present invention, and shown in an expanded view similar to that of FIG. 2.

Referring to FIG. 6, a third embodiment of the present invention is illustrated. In referring to FIG. 6, similar labels to those utilized above with respect to FIGS. 3–5 will be used, with differences indicated with the suffix "b" or with different numerals. FIG. 6 shows an SOI construction 50b within an apparatus 10 (shown in FIG. 1), in a view similar to that of FIGS. 2, 3 and 5. Construction 50b comprises a substrate 52b, an insulator layer 54b, and a semiconductive material layer 56b. Substrate 52b preferably comprises a uniformly doped semiconductive substrate, insulator layer 54b preferably comprises an insulative material such as silicon nitride or silicon dioxide, and semiconductive material 56b preferably comprises a p-type doped silicon material.

A conductive material 90 is provided within insulative material 54b. Conductive material 90 changes an electric field within portion 60b and thereby causes depletion region 58b to have a different thickness within portion 60b than within portion 62b. Conductive material 90 could comprise, for example, a metallic material, such as titanium or tungsten. Although conductive material 90 is shown within insulator layer 54b, it will be recognized by persons of ordinary skill in the art that conductive material 90 could also be provided within substrate 52b to achieve a similar effect on depletion region 58b as that illustrated.

SOI assembly 50b also comprises a trench 84b, similar to trench 84 in FIG. 5. Trench 84b causes a thickness of depletion region 58b to be altered within region 64b relative to the thickness of depletion region 58b within, for example, region 62b.

After formation of depletion region 58b, the electrolytic etching component 14 (shown in FIG. 1) can be utilized to etch to about depletion region 58b to form an SOI construction having an undulating outer surface shaped similar to depletion region 58b.

The SOI assemblies produced by the methods discussed above with reference to FIGS. 3–6 may be utilized to form semiconductor devices. For instance, a thin film transistor may be formed according to a process illustrated in FIGS. 7 and 8. In referring to FIGS. 7 and 8, similar labels to those utilized above with reference to FIGS. 3–6 will be utilized, with differences indicated by the suffix "c" or with different numerals.

Referring to FIG. 7, an SOI assembly 50c is illustrated. Assembly 50c comprises a substrate 52c, an insulator layer 54c, and a semiconductive material layer 56c. A source template region 100, a channel template region 102, and a drain template region 104 are defined within assembly 50c. A depletion region 58c is formed within semiconductive layer 56c. Depletion region 58c can be formed by one or more of the methods discussed above with reference to FIGS. 3–6. Depletion region 58c is formed over source template region 100, channel template region 102 and drain template region 104. Depletion region 58c is proximate insulator layer 54c, and has a different thickness within channel template region 102 than within source and drain template regions 100 and 104.

While the depletion region 58c is formed, semiconductive layer 56c is exposed to an electrolytic etching composition (such as composition 14 shown in FIG. 1) and etched to about depletion region 58c.

Referring to FIG. 8, SOI assembly 50c is shown after such etching. As shown, the etched semiconductive layer 56c comprises a different thickness within channel template region 102 than within source and drain template regions 100 and 104. In the shown embodiment, semiconductive material 56c is thinner within channel template region 102 than within source and drain template regions 100 and 104. However, as will be recognized by persons of ordinary skill in the art, alternative embodiments could be utilized in which the thickness of insulator layer 56c is greater within channel template region 102 than within source and drain template regions 100 and 104.

The etched semiconductive layer 56c within source and drain template regions 100 and 104 is then conductively doped to form source and drain regions 106 and 108, respectively. Also, a transistor gate 110 is formed over the etched semiconductive material 56c within channel template region 102 to utilize the material 56c within region 102 as a transistor channel 112. Channel 112, transistor gate 110, source region 106 and drain region 108 together comprise a transistor device 114.

A thickness of channel 112 is controlled by controlling a thickness of region 58c within channel template region 102. Such control of the thickness of channel 112 can be utilized to create a desired threshold voltage for transistor device 114.

Figure 9:
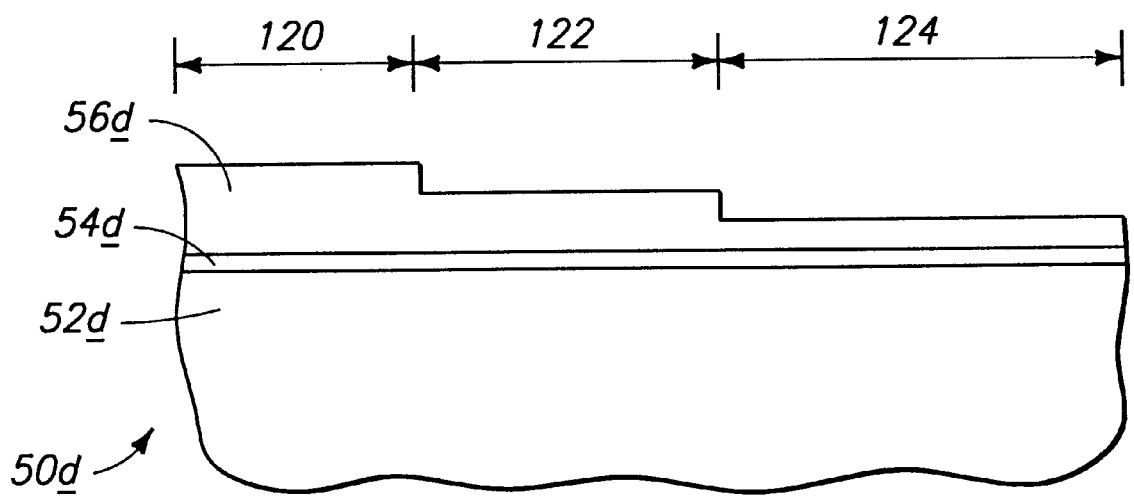
FIG. 9 is a fragmentary cross-sectional view of a semiconductor assembly formed according to a fifth embodiment method of the present invention.

Referring to FIG. 9, a method of the present invention can be utilized to selectively adjust thicknesses of peripheral n-channel transistor devices, peripheral p-channel transistor devices, and memory array devices, formed on SOI assemblies. In referring to FIG. 9 similar labels to those utilized above in describing FIGS. 1–8 will be used, with differences indicated by the suffix "d" or different numerals.

FIG. 9 illustrates an SOI assembly 50d comprising a substrate 52d, an insulator layer 54d and a semiconductive layer 56d. Within SOI assembly 50d are defined a peripheral p-channel device region 120, a peripheral n-channel device region 122, and a memory array device region 124. Ultimately, p-channel transistors (not shown) will be formed within region 120, n-channel transistors (not shown) will be formed within region 122, and memory array transistors (not shown) will be formed within region 124. The methods discussed above regarding FIGS. 3–8 can be utilized to adjust relative thicknesses of semiconductive material 56d in the regions 120, 122 and 124 to enable the ultimately formed p-channel devices, n-channel devices and memory array devices to be formed over regions of semiconductive material 56d with locally varying thicknesses of channel regions and/or source/drain regions. In fully depleted SOI a threshold voltage can be influenced by a silicon layer thickness, as well as by variations of doping within the silicon layer. Thus, local variation of thickness of the semiconductive layer 56d within regions 120, 122 and 124 can be utilized to adjust a threshold voltage of the peripheral devices formed in regions 120 and 122 to be different from a threshold voltage of the memory array devices formed in region 124.

Figure 10:
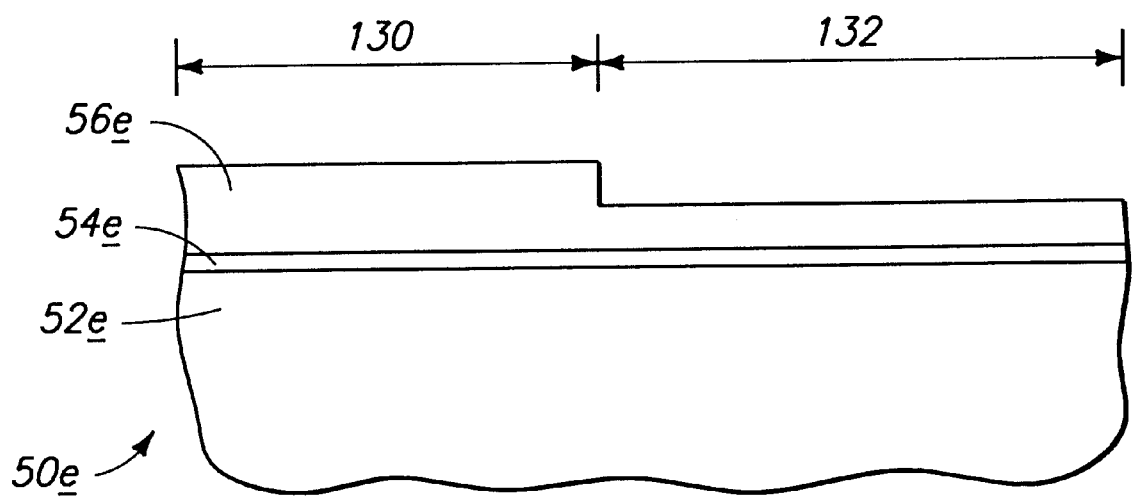
FIG. 10 is a fragmentary cross-sectional view of a semiconductor assembly formed according to a sixth embodiment method of the present invention.

Referring to FIG. 10, a method of the present invention can be utilized to form SOI assemblies in which a semiconductive layer has a different thickness in a fully depleted SOI region than in a partially depleted SOI region. Generally, the semiconductive material would be thicker in a partially depleted SOI region than in a fully depleted SOI region, although, as will be recognized by persons of ordinary skill in the art, methods of the present invention can be utilized to form opposite structures as well.

In referring to FIG. 10, similar labels to those utilized in discussing FIGS. 3–9 above will be utilized, with differences indicated by the suffix "e" or by different numerals.

FIG. 10 illustrates an SOI assembly 50e comprising a substrate 52e, an insulator layer 54e, and a semiconductive layer 56e. Within SOI assembly 50e are defined partially depleted SOI template regions 130 and fully depleted SOI template regions 132. Semiconductive material 56e is thicker within the partially depleted SOI regions 130 than within fully depleted SOI regions 132. Such variation in the thickness of semiconductive material 56e can be accomplished by the methods discussed above regarding FIGS. 3–6.

To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Although the embodiments discussed above are described with reference to formation of SOI structures utilizing the apparatus of FIG. 1, it is to be understood that other apparatuses could be utilized in methods of the present invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming a semiconductor-on-insulator layer comprising:

provideing a substrate;

providing an insulator layer over the substrate;

providing a semiconductive layer over the insulator layer, the semiconductive layer having a first portion and a second portion;

forming a depletion region within the semiconductive layer and proximate the insulator layer;

controlling a thickness of the depletion region to provide the depletion region with a different thickness in the first portion than in the second portion; and etching the semiconductive layer to about the depletion region.

2. The method of claim 1 wherein the substrate comprises a semiconductive material and wherein the substrate beneath the first portion has a different conductivity than the substrate beneath the second portion.

3. The method of claim 1 wherein the etching comprises utilizing a potassium hydroxide solution to etch the semiconductive layer.

4. The method of claim 1 wherein the substrate comprises a semiconductive material and wherein the substrate beneath the first portion is doped differently than the substrate beneath the second portion.

5. The method of claim 1 wherein a trench is provided beneath the first portion and not beneath the second portion.

6. The method of claim 1 wherein a metal-comprising layer is provided beneath the first portion and not beneath the second portion.

7. The method of claim 1 wherein the insulator layer is formed of two materials, the two materials comprising a first material which underlies the first portion and a second material which underlies the second portion.

8. The method of claim 7 wherein the first material comprises silicon nitride and wherein the second material comprises silicon oxide.

9. A method of forming a semiconductor-on-insulator layer comprising:
providing a substrate;
providing an insulator layer over the substrate;
providing a semiconductive layer over the insulator layer, the semiconductive layer having a first portion and a second portion;
forming a depletion region within the semiconductive layer and proximate the insulator layer;
controlling a thickness of the depletion region by varying a conductivity of the substrate beneath the semiconductive layer to provide the depletion region with a different thickness in the first portion than in the second portion; and
etching the semiconductive layer to about the depletion region.

10. The method of claim 9 wherein the substrate comprises a different conductivity type dopant under the first portion than under the second portion.

11. The method of claim 9 wherein the substrate comprises a different concentration of dopant under the first portion than under the second portion.

12. A method of forming a semiconductor-on-insulator layer comprising:
providing a substrate;
providing an insulator layer over the substrate, the insulator layer comprising a first material and a second material;
providing a semiconductive layer over the insulator layer;
forming a depletion region within the semiconductive layer and proximate the insulator layer, the depletion region having a different thickness over the first material than over the second material; and
etching the semiconductive layer to about the depletion region.

13. The method of claim 12 wherein the insulator layer first material comprises silicon nitride and wherein the insulator layer second material comprises silicon oxide.

14. A method of forming a semiconductor-on-insulator layer comprising:
forming a semiconductive layer over an insulator layer;
forming a depletion region within the semiconductive layer, a predominate portion of the depletion region having a base thickness, the depletion region comprising at least one stepped segment which has a thickness different than the base thickness, the stepped segment being between portions of the depletion region which have the base thickness; and
while the depletion region is formed, exposing the semiconductive layer to an etching composition to etch the semiconductive layer to about the depletion region.

15. The method of claim 14 wherein the stepped segment of the depletion region is closer to the insulator layer than are portions of the depletion region having the base thickness.

16. The method of claim 14 wherein the stepped segment of the depletion region is further from the insulator layer than are portions of the depletion region having the base thickness.

17. The method of claim 14 wherein the forming of the depletion region comprises subjecting the semiconductive layer to a voltage.

18. A method of forming a semiconductor-on-insulator layer comprising:
providing a semiconductive substrate;
forming a conductivity-modifying diffusion region in only a portion of the substrate;
forming an insulator layer over the semiconductive substrate;
forming a semiconductive layer over the insulator layer;
forming a depletion region within the semiconductive layer, the depletion region being proximate the insulator layer and having a different thickness over the conductivity-modifying diffusion region than over other portions of the substrate; and
while the depletion region is formed, exposing the semiconductive layer to an etching composition to etch the semiconductive layer to about the depletion region.

19. A method of forming a semiconductor-on-insulator layer comprising:
providing a semiconductive substrate having substantially uniform doping with a first impurity;
doping a first portion of the semiconductive substrate with a second impurity while leaving a second portion of the semiconductive substrate not doped with the second impurity;
forming an insulator layer over the semiconductive substrate;
forming a semiconductive layer over the insulator layer;
forming a depletion region within the semiconductive layer, the depletion region being proximate the insulator layer and having a different thickness over the first portion of the substrate than over the second portion of the substrate; and
while the depletion region is formed, exposing the semiconductive layer to an etching composition to etch the semiconductive layer to about the depletion region.

20. The method of claim 19 wherein the first impurity comprises a p-type dopant.

21. The method of claim 19 wherein the first impurity comprises an n-type dopant.

22. The method of claim 19 wherein the first impurity and the second impurity comprise a common conductivity type.

23. The method of claim 19 wherein the first impurity comprises a first conductivity-type dopant and wherein the second impurity comprises a second conductivity-type dopant, the second conductivity type being different than the first conductivity type.

24. The method of claim 19 wherein the first impurity and the second impurity comprise a common dopant.

25. A method of forming a semiconductor-on-insulator layer comprising:
providing a semiconductive substrate having substantially uniform doping with a first impurity of a first conductivity type;
doping a first portion of the semiconductive substrate with a second impurity having the first conductivity type;

doping a second portion of the semiconductive substrate with a third impurity having a second conductivity type;

leaving a third portion of the semiconductive substrate undoped with either of the second impurity or the third impurity;

forming an insulator layer over the semiconductive substrate;

forming a semiconductive layer over the insulator layer;

substantially uniformly doping the semiconductive layer with a p-type impurity;

forming a depletion region within the semiconductive layer, the depletion region being over the first portion, the second portion, and the third portion, the depletion region being proximate the insulator layer and having a different thickness over the first portion of the substrate than over the second and third portions, the depletion region having a different thickness over the second portion of the substrate than over the first and third portions; and while the depletion region is formed, exposing the semiconductive layer to an electrolytic etching composition to etch the semiconductive layer to about the depletion region.

26. The method of claim 25 wherein the first conductivity type is p-type and the second conductivity type is n-type.

27. The method of claim 25 wherein the first conductivity type is n-type and the second conductivity type is p-type.

28. The method of claim 25 wherein the first impurity and the second impurity comprise a common dopant.

29. A method of forming a semiconductor-on-insulator layer comprising:

providing a semiconductive substrate having substantially uniform doping with a first impurity;

doping a first portion of the semiconductive substrate with a second impurity;

doping a second portion of the semiconductive substrate with a third impurity;

leaving a third portion of the semiconductive substrate undoped with either of the second impurity or the third impurity;

forming an insulator layer over the semiconductive substrate;

forming a semiconductive layer over the insulator layer;

substantially uniformly doping the semiconductive layer with a p-type impurity;

forming a depletion region within the semiconductive layer, the depletion region being over the first portion, the second portion and the third portion, the depletion region being thicker over the first portion of the substrate relative to over the second and third portions, the depletion region being thinner over the second portion of the substrate relative to over the first and third portions; and while the depletion region is formed, exposing the semiconductive layer to an electrolytic etching composition to etch the semiconductive layer to about the depletion region.

30. The method of claim 29 wherein the first and second impurities comprise a p-conductivity type, and wherein the third impurity comprises an n-conductivity type.

31. The method of claim 29 wherein the first impurity and the second impurity comprise a common conductivity type.

32. The method of claim 29 wherein the first impurity and the second impurity comprise p-conductivity type.

33. The method of claim 29 wherein the first impurity and the second impurity comprise a common dopant.

34. A semiconductor processing method of forming fully depleted SOI and partially depleted SOI on the same wafer comprising:

providing a substrate;

defining fully depleted SOI template portions and partially depleted SOI template portions of the substrate;

forming an insulator layer over the substrate;

forming a semiconductive layer over the insulator layer;

forming a depletion region within the semiconductive layer, the depletion region being over the partially depleted SOI template portion and over the fully depleted SOI template portion, the depletion region being proximate the insulator layer and being thicker over the fully depleted SOI template portion than over the partially depleted SOI template portion;

while the depletion region is formed, exposing the semiconductive layer to an electrolytic etching composition to etch the semiconductive layer to about the depletion region, the etched semiconductive layer comprising a greater thickness over the fully depleted SOI template portion than over the partially depleted SOI template portion;

forming a fully depleted SOI from the etched semiconductive layer over the fully depleted SOI template portion; and forming a partially depleted SOI from the etched semiconductive layer over the partially depleted SOI template portion.

35. The method of claim 34 wherein the substrate is a semiconductive substrate, the method further comprising;

before forming the depletion region, doping the fully depleted SOI template portion of the semiconductive substrate differently than the partially depleted SOI template portion of the semiconductive substrate.

* * * * *

UNITED STATES PATENT AND TRADEMARK OFFICE
CERTIFICATE OF CORRECTION

PATENT NO. : 5,940,691
DATED : August 17, 1999
INVENTOR(S) : H. Montgomery Manning It is certified that error appears in the above-identified patent and that said Letters Patent are hereby corrected as shown below:

Col. 2, l. 32: Before "construction" insert --SOI--

Signed and Sealed this

First Day of May, 2001

Attest:

NICHOLAS P. GODICI

Attesting Officer     Acting Director of the United States Patent and Trademark Office